(12) United States Patent
Andersen et al.

(10) Patent No.: US 7,061,312 B2
(45) Date of Patent: Jun. 13, 2006

(54) SYSTEMS AND METHODS FOR PROVIDING MULTI CHANNEL PULSE WIDTH MODULATED AUDIO WITH STAGGERED OUTPUTS

(75) Inventors: Jack B. Andersen, Austin, TX (US); Wilson E. Taylor, Austin, TX (US)

(73) Assignee: D2Audio Corporation, Austin, TX (US)

( * ) Notice: Subject to any disclaimer, the term of this patent is extended or adjusted under 35 U.S.C. 154(b) by 85 days.

(21) Appl. No.: 10/843,851

(22) Filed: May 12, 2004

(65) Prior Publication Data

US 2004/0207466 A1  Oct. 21, 2004

Related U.S. Application Data

(63) Continuation-in-part of application No. 10/805,590, filed on Mar. 19, 2004.

(60) Provisional application No. 60/469,640, filed on May 12, 2003, provisional application No. 60/469,774, filed on May 12, 2003, provisional application No. 60/456,414, filed on Mar. 21, 2003, provisional application No. 60/456,430, filed on Mar. 21, 2003, provisional application No. 60/456,429, filed on Mar. 21, 2003, provisional application No. 60/456,421, filed on Mar. 21, 2003, provisional application No. 60/456,422, filed on Mar. 21, 2003, provisional application No. 60/456,428, filed on Mar. 21, 2003, provisional application No. 60/456,420, filed on Mar. 21, 2003, provisional application No. 60/456,427, filed on Mar. 21, 2003.

(51) Int. Cl.
*H03F 3/38* (2006.01)

(52) U.S. Cl. ...................................... 330/10

(58) Field of Classification Search ...................... None
See application file for complete search history.

(56) References Cited

U.S. PATENT DOCUMENTS

| 4,415,862 | A | 11/1983 | Kunugi | |
|---|---|---|---|---|
| 6,429,737 | B1 | 8/2002 | O'Brien | |
| 6,731,162 | B1* | 5/2004 | Yeongha et al. | 330/10 |
| 6,812,785 | B1* | 11/2004 | Masuda et al. | 330/10 |
| 6,917,242 | B1* | 7/2005 | Masuda et al. | 330/10 |
| 2003/0058039 | A1* | 3/2003 | Noro | 330/10 |
| 2004/0028243 | A1* | 2/2004 | Seo et al. | 381/97 |

* cited by examiner

*Primary Examiner*—Robert Pascal
*Assistant Examiner*—Krista M. Flanagan
(74) *Attorney, Agent, or Firm*—Law Office of Mark L. Berrier

(57) ABSTRACT

Systems and methods for reducing the noise level in a multi-channel digital audio system by staggering the timing of the pulse-width modulation in the different channels and thereby reducing the magnitude and increasing the frequency characteristics of the generated switching noise. One embodiment comprises a multi-channel digital PWM amplifier in which the timing signals used by each channel's modulator are staggered to evenly space the switching edges of the generated PWM signals. An additional, complementary delay is implemented in each of the channels to equalize the total delay for each channel so that the outputs of the channels are synchronized. The different channels may be implemented on different chips, in which case the chips may be synchronized prior to staggering the signals processed in each of the channels.

13 Claims, 7 Drawing Sheets

SYSTEMS AND METHODS FOR PROVIDING MULTI CHANNEL PULSE WIDTH MODULATED AUDIO WITH STAGGERED OUTPUTS

RELATED APPLICATIONS

This application claims priority to U.S. Provisional Patent Application No. 60/469,640, entitled "Multi Channel PWM With Staggered Outputs," by Andersen, et al., filed May 12, 2003; and is a continuation-in-part of U.S. patent application Ser. No. 10/805,590, entitled "Phase Alignment of Audio Output Data in a Multi-Channel Configuration," filed on Mar. 19, 2004 by Hand, et al., which in turn claims priority to U.S. Provisional Patent Application No. 60/469,774, entitled "Phase Alignment of Output Audio in a Multi-SRC Configuration," by Hand, et al., filed May 12, 2003, U.S. Provisional Patent Application No. 60/456,414, entitled "Adaptive Anti-Clipping Protection," by Taylor, et al., filed Mar. 21, 2003, U.S. Provisional Patent Application No. 60/456,430, entitled "Frequency Response Correction," by Taylor, et al., filed Mar. 21, 2003, U.S. Provisional Patent Application No. 60/456,429, entitled "High-Efficiency, High-Performance Sample Rate Converter," by Andersen, et al., filed Mar. 21, 2003, U.S. Provisional Patent Application No. 60/456,421, entitled "Output Device Switch Timing Correction," by Taylor, et al., filed Mar. 21, 2003, U.S. Provisional Patent Application No. 60/456,422, entitled "Output Filter, Phase/Timing Correction," by Taylor, et al., filed Mar. 21, 2003, U.S. Provisional Patent Application No. 60/456,428, entitled "Output Filter Speaker/Load Compensation," by Taylor, et al., filed Mar. 21, 2003, U.S. Provisional Patent Application No. 60/456,420, entitled "Output Stage Channel Timing Calibration," by Taylor, et al., filed Mar. 21, 2003, and U.S. Provisional Patent Application No. 60/456,427, entitled "Intelligent Over-Current, Over-Load Protection," by Hand, et al., filed Mar. 21, 2003; each of which is fully incorporated by reference as if set forth herein in its entirety.

BACKGROUND

1. Field of the Invention

The invention relates generally to audio amplification systems and more particularly to systems and methods for modifying the timing of one or more channels of an audio amplification system to stagger switching noise in the channels and thereby modify the character of the noise.

2. Related Art

Pulse Width Modulation (PWM) or Class D signal amplification technology has existed for a number of years. PWM technology has become more popular with the proliferation of Switched Mode Power Supplies (SMPS). Since this technology emerged, there has been an increased interest in applying PWM techniques in signal amplification applications as a result of the significant efficiency improvement that can be realized through the use of Class D power output topology instead of the legacy (linear Class AB) power output topology.

Early attempts to develop signal amplification applications utilized the same approach to amplification that was being used in the early SMPS. More particularly, these attempts utilized analog modulation schemes that resulted in low performance applications. These applications were complex and costly to implement. Consequently, these solutions were not widely accepted. Class D technology was therefore unable to displace legacy Class AB amplifiers in mainstream amplifier applications.

Recently, digital PWM modulation schemes have surfaced. These schemes use Sigma-Delta modulation techniques to generate the PWM signals used in the newer digital Class D implementations. These digital PWM schemes, however, did little to offset the major barriers to integration of PWM modulators into the total amplifier solution. Class D technology has therefore continued to be unable to displace legacy Class AB amplifiers in mainstream applications.

There are a number of problems with existing digital PWM modulation schemes. One of the problems is that audio system implementations are requiring increasing numbers of channels. For example, a home theater audio system may need to provide not only a single pair of stereo channels, but also a second pair of stereo channels (for a pair of front speakers and a pair of back speakers) and a center channel (e.g., for a sub-woofer speaker). Another example of a system that may require a large number of channels is a system which is intended to provide audio to a large area, such as multiple rooms within a building. Implementations such as these require more channels than are typically provided in a digital PWM system.

Existing digital PWM amplification systems only have as many channels as can be implemented on a single chip. Typically, these systems have either two or four channels. While it is possible to provide additional channels on a single chip, this typically is not a practical solution for several reasons. For example, there simply may not be enough space on the chip to implement the additional channels. It may also be possible that there are not enough resources (e.g., processor cycles) to process all of the channels on the same chip. Further, the complexity of the design may increase dramatically with the additional channels. Still further, even if a few additional channels could be accommodated, such a solution would not address the next generation of system requirements in which still more channels were required.

Existing digital PWM systems are not implemented across multiple chips because of difficulties that are associated with the interaction of multiple chips. One such difficulty may be the problem of synchronization. In order for the system to provide coherent control of all of the channels in the system, it is necessary to synchronize each of the chips so that they operate essentially as if the system were implemented on a single chip. No such mechanism currently exists for digital PWM audio amplification systems. Another problem is that, once the chips are synchronized, if the data content of the channels is highly correlated, all of the channels are switched almost simultaneously. This is problematic because the switching causes noise in the audio signal, and the near-simultaneous switching of all of the channels increases the noise level. It should be noted that this switching noise occurs in single-chip systems, as well as multi-chip systems.

SUMMARY OF THE INVENTION

One or more of the problems outlined above may be solved by the various embodiments of the invention. Broadly speaking, the invention comprises systems and methods for reducing the noise level in a multi-channel audio system. In one embodiment, this is achieved by providing a mechanism through which multiple audio channels are synchronized, then the audio signals processed by each channel are selectively delayed to stagger the switching in each channel, thereby effectively reducing the noise level and increasing the frequency of the noise so that it can be more easily eliminated.

One embodiment of the invention comprises a system having a plurality of audio amplifier channels and control circuitry coupled to the audio amplifier channels, where the control circuitry is configured to temporally shift the switching edges in the audio signals of at least one of the audio amplifier channels. In one embodiment, the system is a digital pulse-width modulated (PWM) amplifier. Each of the channels of the amplifier includes a modulator for converting a pulse code modulated audio signal to a pulse-width modulated signal. The system, using the modulators, is configured to progressively delay the audio signal in successive ones of the channels, so that the rising and falling edges (the switching edges) of highly correlated signals fall at different times in different channels. In one embodiment, each of the modulators receives a timing signal from a common counter, adds or subtracts an offset to this signal, and performs a modulo operation on the result to generate an offset timing signal that causes the staggering of the generated width-modulated pulses and the corresponding switching edges. In one embodiment, a complementary delay is implemented in each of the channels to compensate for the delay which staggers the switching edges. The total delay in each of the channels is therefore the same, and the outputs are synchronized. In one embodiment, each channel includes an interpolator, and the complementary delay is implemented in the interpolation performed by the interpolator. In one embodiment, the audio amplifier channels are implemented on multiple, separate chips, and the system includes a mechanism for synchronizing the operation of the chips.

One embodiment of the invention comprises a method for staggering the switching edges of PWM signals in different channels of a digital PWM audio amplifier to reduce the level of switching noise and increase the frequency of the noise. In one embodiment, the method includes shifting the timing of the PWM audio signals in one or more of the channels so that the switching edges of highly correlated signals in the different channels are not coincident. In one embodiment, the signals are staggered evenly throughout the interval between pulses. In one embodiment, a complementary delay is implemented in each of the channels to compensate for the delay which staggers the switching edges in order to equalize the total delay in each of the channels and thereby synchronize the outputs of the channels. In one embodiment, the staggering of the switching edges is performed in the modulator of each channel, and the complementary delay is added in the interpolation of the audio signal. In one embodiment, the audio amplifier channels are implemented on multiple, separate chips, and the method includes synchronizing the operation of the chips before staggering the signals and adding the complementary delays.

Numerous additional embodiments are also possible.

BRIEF DESCRIPTION OF THE DRAWINGS

Other objects and advantages of the invention may become apparent upon reading the following detailed description and upon reference to the accompanying drawings.

Figure 1:
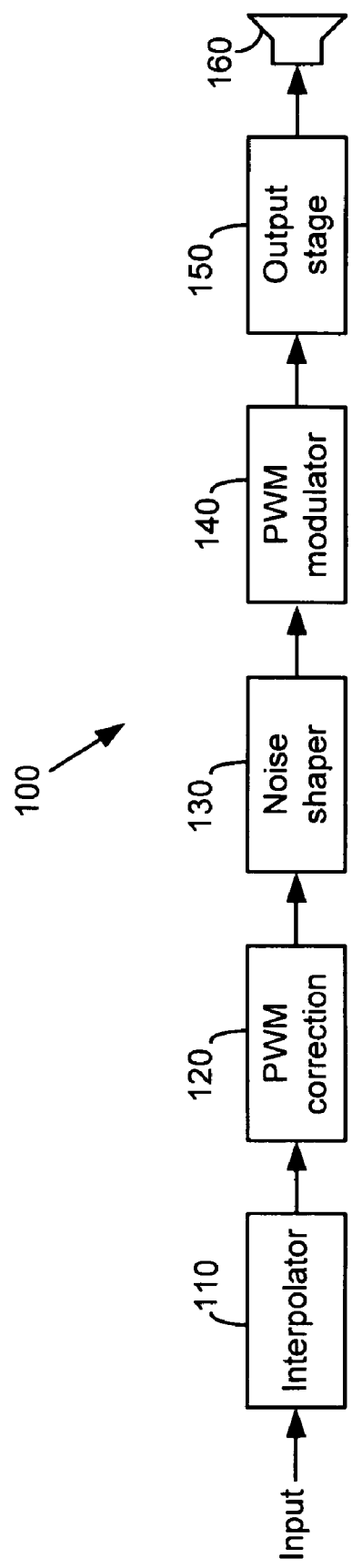
FIG. 1 is a functional block diagram illustrating a channel of a digital audio amplification system in accordance with one embodiment.

While the invention is subject to various modifications and alternative forms, specific embodiments thereof are shown by way of example in the drawings and the accompanying detailed description. It should be understood, however, that the drawings and detailed description are not intended to limit the invention to the particular embodiment which is described. This disclosure is instead intended to cover all modifications, equivalents and alternatives falling within the scope of the present invention as defined by the appended claims.

DETAILED DESCRIPTION OF PREFERRED EMBODIMENTS

One or more embodiments of the invention are described below. It should be noted that these and any other embodiments described below are exemplary and are intended to be illustrative of the invention rather than limiting.

As described herein, various embodiments of the invention comprise systems and methods for reducing the noise level in a multi-channel digital audio system. In one embodiment, this is achieved by providing a mechanism through which multiple digital audio channels are synchronized, then the audio signals processed by each channel are selectively delayed to stagger the switching in each channel, thereby effectively reducing the noise level and increasing the frequency of the noise so that it can be more easily eliminated.

One embodiment of the invention comprises a digital pulse-width modulated (PWM) audio amplification system. This system has a plurality of channels for separately processing audio signals. Each channel receives a pulse-code modulated (PCM) audio signal and processes this signal to generate a PWM output signal. The output PWM signal comprises a binary pulse. "Binary," as used here, means that the signal can have one of only two values—high or low. The pulses are typically generated at a fixed frequency (e.g., 384 kHz) and have varying widths. The pulses are used to turn transistors in the output stage on and off, thereby generating an analog audio signal that can be used, e.g., to drive speakers.

The audio signals on multiple channels may be highly correlated. That is, the signals may be the same, or may be very similar. As a result, the PWM signals generated for each of the audio streams may be very similar. If the PWM pulses of two channels are nearly the same, and if the signals are synchronized, the rising and falling edges (which may be referred to herein as the switching edges) of the pulses in the different channels may occur at the same time. As noted above, the rising and falling edges of the PWM signals cause transistors in the output stage to turn on and off. Whenever one of the transistors is turned on or off, noise is generated. If the transistors of multiple channels are turned on or off at the same time, the noise level increases.

The embodiments of the present invention can help manage this switching noise by shifting the timing with which the PWM pulses are generated in the different channels and thereby shifting the noise spikes caused by the switching so that the noise is more evenly distributed, rather than occurring at the same time for multiple channels. This can improve the character of the noise in two ways. First, because the noise from the different channels no longer occurs at the same time, the level of the noise is reduced. Second, because the noise spikes occur more often, the frequency spectrum of the noise is higher and may be less likely to affect the audible spectrum of the audio signal. It may also be easier to filter out the noise when it is at a higher frequency.

As noted above, one embodiment of the invention comprises a digital PWM audio amplification system. Referring to FIG. 1, a functional block diagram illustrating a channel of a digital audio amplification system is shown. This embodiment is designed to convert a PCM input data stream to a PWM output data stream that can drive an output stage.

As depicted in FIG. 1, channel 100 receives a digital input data stream from a data source such as a CD player, MP3 player, digital audio tape, or the like. The input data stream is received by interpolator 110, which interpolates the data stream to convert the data stream from a first sample rate to a second sample rate. The first sample rate depends upon the data source and is typically one of a set of predetermined sample rates that are used by the corresponding type of device. For example, a CD player may output digital data with a sample rate of 44.1 kHz, while a digital audio tape player may output data with a sample rate of 32 kHz. Interpolator 110 converts the data stream to the switching rate of the modulators and output stages. In one embodiment, this switching rate is 384 kHz.

This data stream at the switching rate is then provided to a PWM correction unit 120. PWM correction unit 120 corrects the data stream for the non-linearities of the PWM process and provides the resulting data stream to noise shaper 130. Noise shaper 130 reduces the high-precision input bit width to the limited bit width handled by modulator 140. The data stream output by noise shaper 130 is provided to PWM modulator 140. The data stream received by PWM modulator 140 represents a pulse code modulated signal. PWM modulator 140 converts this data stream to a pulse width modulated signal. The pulse width modulated signal is then provided to output stage 150. Output stage 150 amplifies the pulse width modulated signal and may perform some filtering or further processing of the amplified signal. The resulting signal is then output to a speaker 160, which converts the PWM signal to an audible signal which can be heard by a listener.

Channel 100 is normally implemented in a single chip. It may be possible to implement two or even four channels in the same chip. Each additional channel typically replicates the components of the first channel. As mentioned above, if it is necessary or desirable to provide more channels (e.g., eight, sixteen, or even more), it may be necessary to use multiple chips, each having several channels.

There are various ways to implement the digital PWM modulator shown in FIG. 1. Typically, digital PWM modulators will generate a binary pulse that is centered in an interval and has a width corresponding to an input value provided to the modulator. For the purposes of the discussion below, the length of the interval is referred to as L, and the width of the pulse is referred to as p. The pulse therefore has a rising edge at $(L-p)/2$ and a falling edge at $(L+p)/2$.

Figure 2:
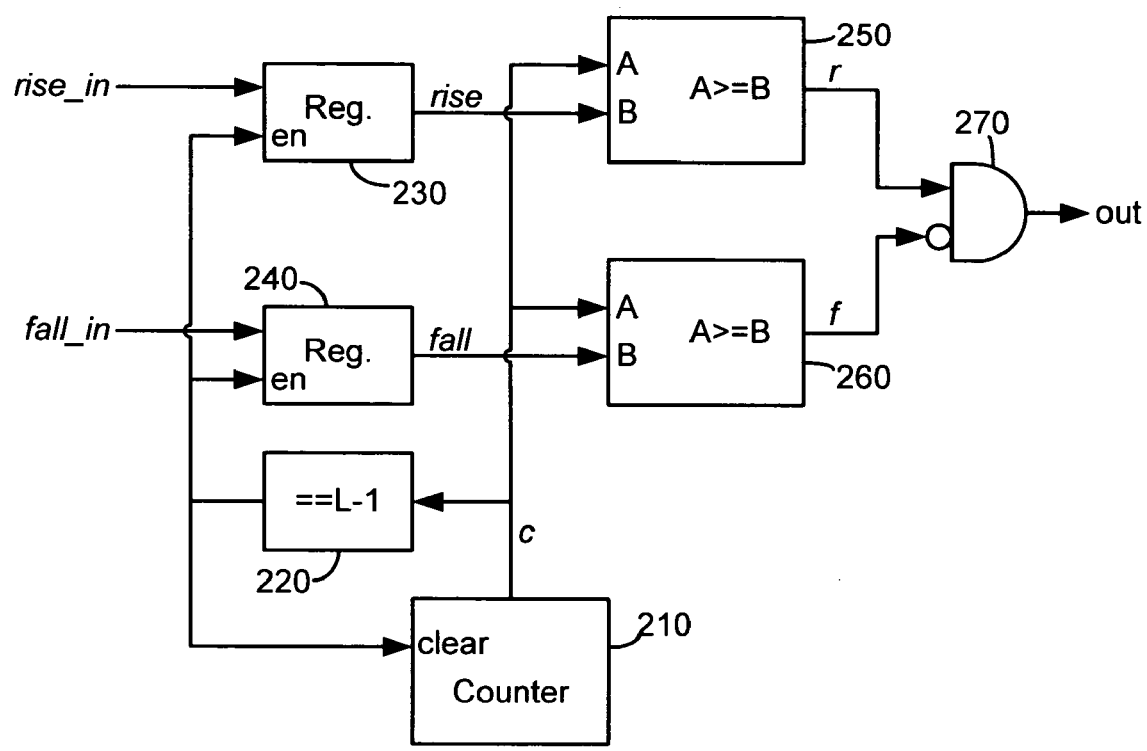
FIG. 2 is a functional block diagram illustrating the structure of a modulator in accordance with one embodiment.

Referring to FIG. 2, a functional block diagram illustrating the structure of a modulator 200 in accordance with one embodiment is shown. In this embodiment, a synchronous counter 210 receives a clock signal, clk, and generates an output signal, c, that increases incrementally. Output signal c is provided to comparator 220. Comparator 220 compares signal c to the value $L-1$, and generates an output signal that is asserted when $c=L-1$. The signal output by comparator 220 is fed back to counter 210 as a "clear" signal. Thus, counter 210 counts upward until its output (c) reaches $L-1$. When output signal c reaches $L-1$, the clear signal output by comparator 220 is asserted, and counter 210 restarts from 0. Counter 210 therefore generates an output signal, c, that repeatedly steps from 0 to $L-1$, then restarts from 0. Signal c can therefore be viewed as forming a sawtooth-shaped signal as shown in the upper portion of FIG. 3.

Referring again to FIG. 2, modulator 200 includes a pair of registers 230 and 240 for receiving rise-time and fall-time values for generating the PWM pulse. More specifically, the rise-time value is provided to register 230, while the fall-time value is provided to register 240. In addition to the inputs for receiving the rise-time and fall-time values, registers 230 and 240 include enable inputs. Each of the enable inputs is coupled to the output of comparator 220, so that, when the output of comparator 220 is asserted, the current rise-time and fall-time values are loaded into registers 230 and 240, respectively. When the output of comparator 220 is deasserted, the values currently stored in registers 230 and 240 are maintained, even though the rise-time and fall-time inputs to these registers may change. Thus, registers 230 and 240 provide, at their respective outputs, the values for the rising and falling edges of the PWM pulse which are updated whenever counter 210 restarts from 0.

Registers 230 and 240 provide threshold rise-time and fall-time values to which the value of signal c is compared, so that the rising and falling edges of the pulse width modulated signal can be generated. The outputs of registers 230 and 240, as well as the output of counter 210 (signal c) are provided to comparator 250 and 260. More specifically, signal c is provided as an input to each of comparators 250 and 260, while the output of register 230 is provided to comparator 250 and the output of register 240 is provided to comparator 260. The outputs of comparators 250 and 260 are then provided to AND gate 270. The output of comparator 260 is inverted before it is provided to AND gate 270.

As counter 210 counts upward from 0 to $L-1$, it is compared by comparators 250 and 260 to the rise-time and fall-time values of registers 230 and 240, respectively. When signal c is less than both the rise-time and fall-time values, the outputs of both comparator 250 and comparator 260 are low. Therefore, one of the inputs to AND gate 270 is low, and one is high. The output of AND gate 270 is therefore low.

When signal c reaches the rise-time value of register 230, comparator 250 generates a high signal. Signal c is still less than the fall-time value, so the output of comparator 260 is still low. The inputs to AND gate 270 are therefore both high (the output of comparator 260 is inverted), so the output of this gate is high.

The output of AND gate 270 remains high until signal c reaches the fall-time value of register 240. When the value of signal c reaches the fall-time value stored in register 240, comparator 260 produces a high signal at its output. The output of comparator 250 also remains high. Because the outputs of both comparators are high (and because one of the outputs is inverted), AND gate 270 receives one high signal and one low signal. The output of AND gate 270 is therefore low.

Thus, the output of AND gate 270 is low for values of signal c that are from 0 to the rise-time value, high for values of signal c that are between the rise-time and fall-time values, and the low for values of signal c that are greater than the fall-time value.

Figure 3:
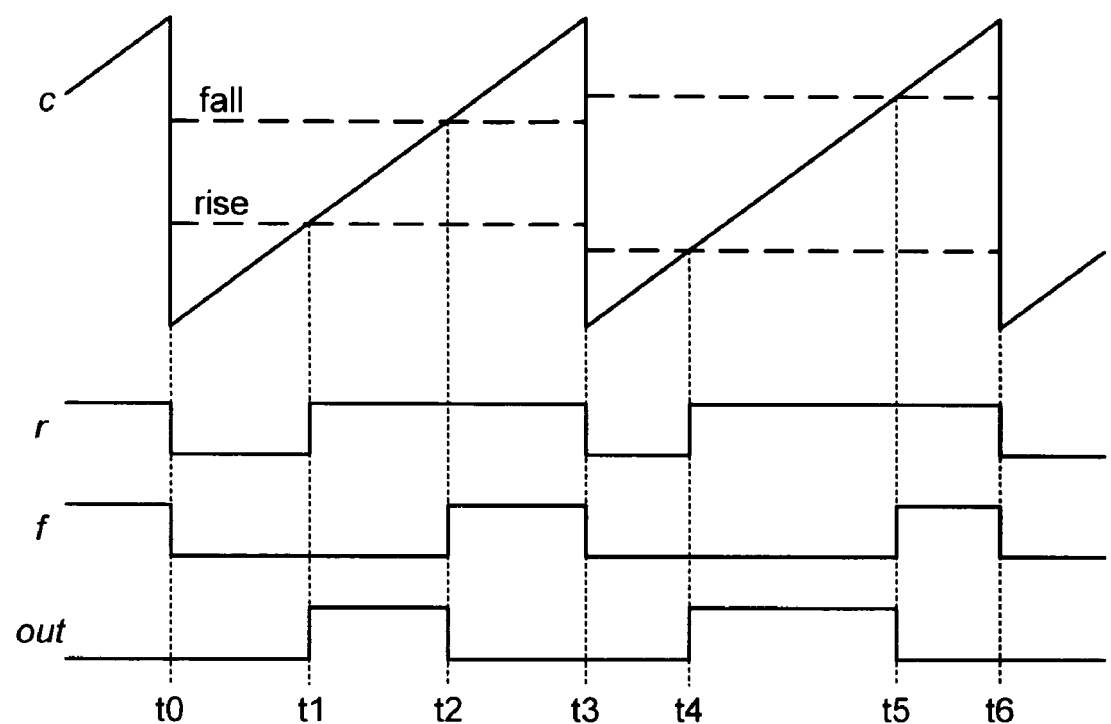
FIG. 3 is a diagram illustrating the signals associated with the system shown in FIG. 2.

The signals associated with the diagram of FIG. 2 are shown in FIG. 3. For ease of reference, the output of register 230 is identified as signal "rise," the output of register 240 is identified as signal "fall," the output of comparator 250 is identified as signal "r," the output of comparator 260 is identified as signal "f," and the output of AND gate 270 is identified as signal "out."

Referring to FIG. 3, signal c increases linearly from 0 to L−1 over the interval from time t0 to t3 (and from t3 to t6, and so on), creating a sawtooth pattern. The values of signals rise and fall during each interval (t0-t3, t3-t6, . . . ) are superimposed over signal c in order to illustrate the points at which c becomes greater than or equal to these signals. When c reaches each of these thresholds during the interval, the corresponding comparator outputs (signals r and f) go from high to low. Because the output of comparator 260 (signal f) is inverted before being input to AND gate 270, the output signal out of the AND gate is high when r is high and f is low, as shown in FIG. 3.

FIG. 3 also illustrates the change in the width of succeeding pulses. In the interval from t0 to t3, signals rise and fall have initial values which result in a pulse that is high from t1 to t2. During the interval from t3 to t6, signals rise and fall have values which result in a pulse that is high from t4 to t5. It can be seen that, because the value of fall increases and rise decreases, the width of the second pulse is greater than the width of the first pulse. In other words, t5-t4 is greater than t2-t1.

Figure 4:
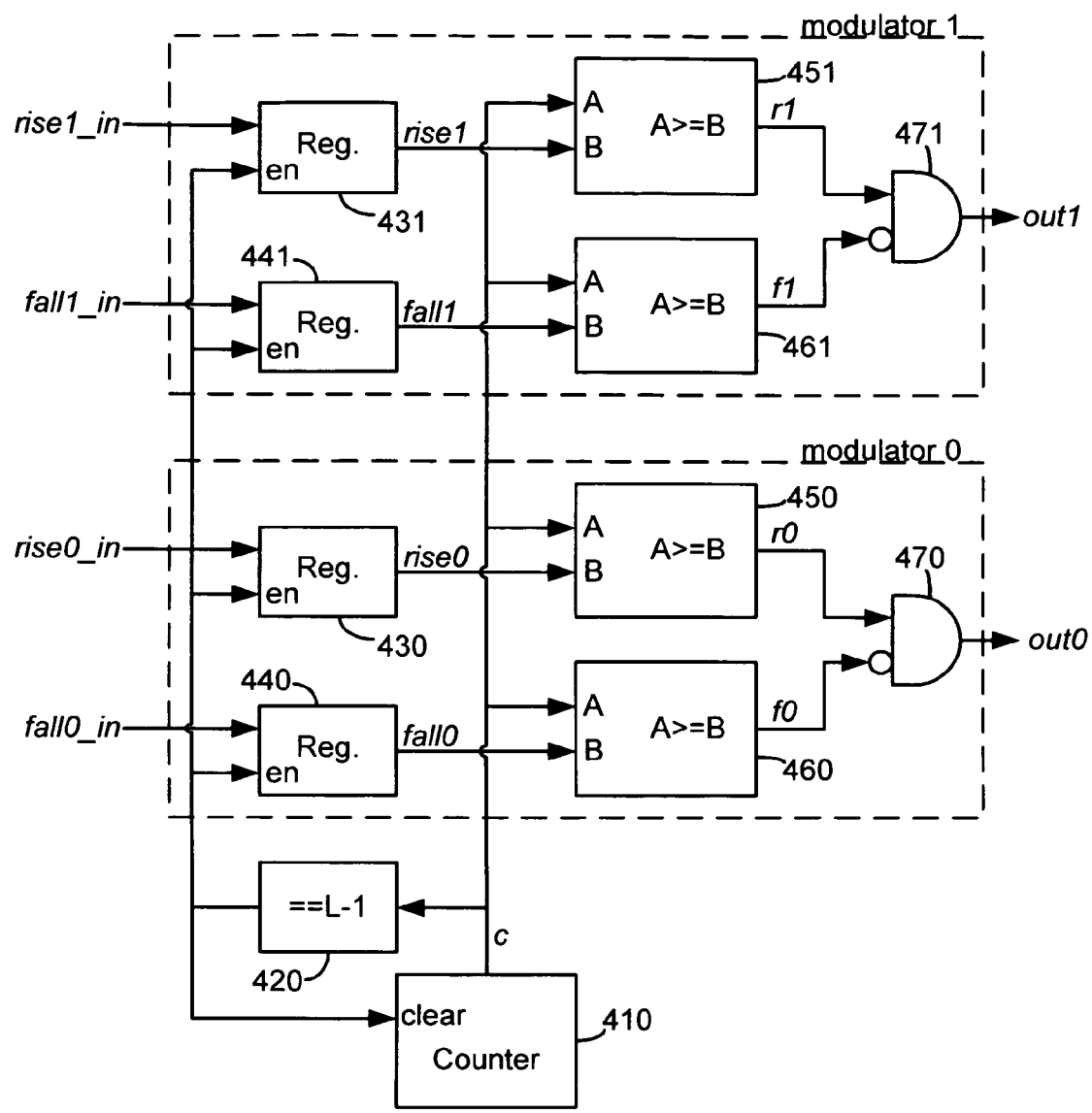
FIG. 4 is a functional block diagram illustrating the structure of a multiple-channel, multiple-modulator system in accordance with one embodiment.

The modulator of FIG. 2 can be extended to multiple channels. A multiple-channel configuration having one modulator per channel is shown in FIG. 4. Each of the modulators has a pair of registers, a pair of comparators and an AND gate as described above in connection with FIG. 2. In one modulator, these components comprise elements 430, 440, 450, 460 and 470. In the other modulator, the components comprise elements 431, 441, 451, 461 and 471. Each of these modulators is coupled to counter 410 and comparator 420. Counter 410 and comparator 420 are shared by each of the modulators.

Because each of the modulators uses the same signal c generated by counter 410 and comparator 420, the modulators are synchronized. The pulses generated by the modulators are all centered at the same point in time. If the signals in all of the modulators are closely correlated (e.g., if the same signal is processed by each of the modulators), the rising and falling edges of the signals will also be coincident, or nearly so. If this is the case, the output signals from each of the modulators will switch from high to low (and from low to high) at about the same time. The noise generated by the switching will therefore be increased in comparison to a single-channel (single-modulator) system.

Figure 5:
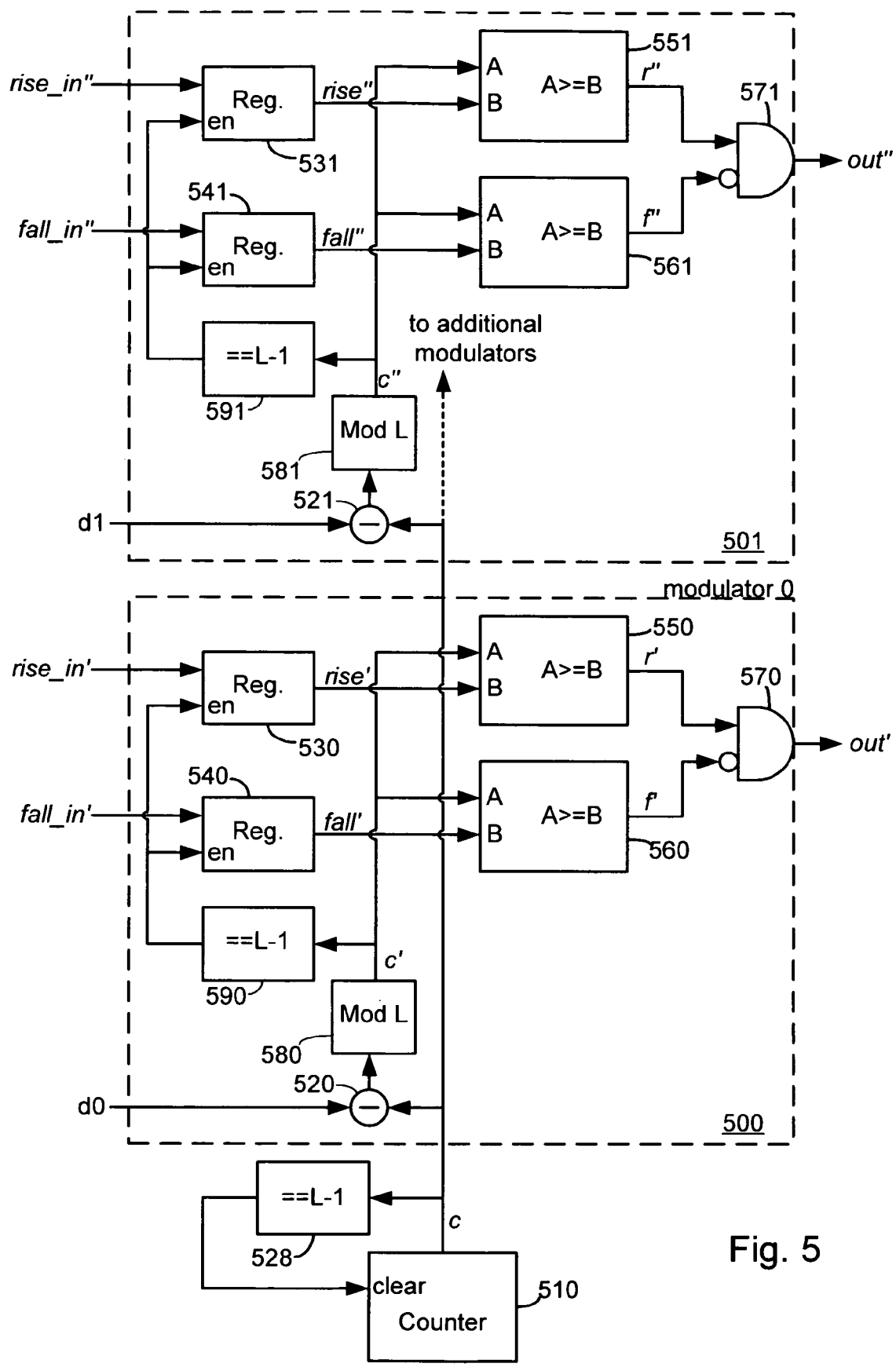
FIG. 5 is a functional block diagram illustrating a system having staggered channel timing in accordance with one embodiment.

Referring to FIG. 5, a functional block diagram illustrating a system having staggered channel timing in accordance with one embodiment is shown. In this figure, each of the modulators again has a pair of registers, a pair of comparators and an AND gate. Rather than operating each of the modulators on the same timing signal, c, however, each modulator in this embodiment has a staggered timing signal.

The timing signal for each modulator is based on a common signal, but one or more of the timing signals is effectively delayed (or advanced), so that the pulses of the different modulators are centered at different times. In other words, the pulses are staggered, or temporally shifted. Then, if the signals processed by the modulators are closely correlated, the rising and falling edges of the pulses in the different modulators will be staggered in the same manner as the timing signals.

In the embodiment of FIG. 5, the base timing signal c is generated by counter 510 and comparator 528. The base timing signal is not provided to the comparators of the different modulators (e.g., 550, 560, 551, 561, . . . ), but is instead provided to difference units 520 and 521. A difference or offset value is provided to each of the difference units to delay (or advance) the timing by a corresponding amount (d0 or d1). This offset value is subtracted from signal c, and a modulo operation is performed on the resulting signals by modulo units 580 and 581. The signals output by modulo units 580 and 581 are then used by the respective modulators in the same way signal c is used in the prior art modulators. In other words, when these signals are equal to L−1, comparators 590 and 591 assert enable signals and the respective rise-time and fall-time registers (530, 540, 531 and 541) are loaded with new values. Also, when these signals output by modulo units 580 and 581 reach the stored rise-time and fall-time values, the respective ones of comparators 550, 560, 551 and 561 switch from low to high, generating pulse width modulated signals at the outputs of AND gates 570 and 571.

In one embodiment, the values of the offsets (d0, d1, etc.) are determined by dividing the interval L by the number of modulators. The different channels are therefore delayed so that the centers of the respective pulses are evenly spaced throughout the interval L. If there are n modulators, each channel is delayed by L/n from the previous channel. For example, d0=0, d1=L/n, d2=2*L/n, and so on. This effectively "spreads out" the switching noise so that the noise level is roughly 1/n times the noise level in a non-staggered system having n channels. Also, the noise frequency is n times higher. In other words, the staggering of the switching edges results in less noise, and the noise is shifted to a higher frequency range, which makes the noise easier to filter out.

The modulo operation used here is defined to return a positive number in the interval [0;L−1]. In one embodiment, the range of inputs c and d0 (or d1) is limited, so the modulo operation can have the simple implementation:

$$
\begin{aligned}
&c1 = c - d0\\
&\text{if } (c1 < 0)\\
&\quad c' = c1 + L\\
&\text{else}\\
&\quad c' = c1
\end{aligned}
$$

where c' is the output of modulo unit 580. The same algorithm can be used for the second modulator, where c' and d0 are replaced by c" (the output of modulo unit 581) and d1.

When L is a power of 2, the implementation above becomes even simpler. In this case, the implementation is to use only the log 2(L) least significant bits of the difference c−d0. Similarly, the comparison to L−1 and the synchronous reset of the counter can be eliminated by using only the log 2(L) least significant bits of the counter output c.

Figure 6:
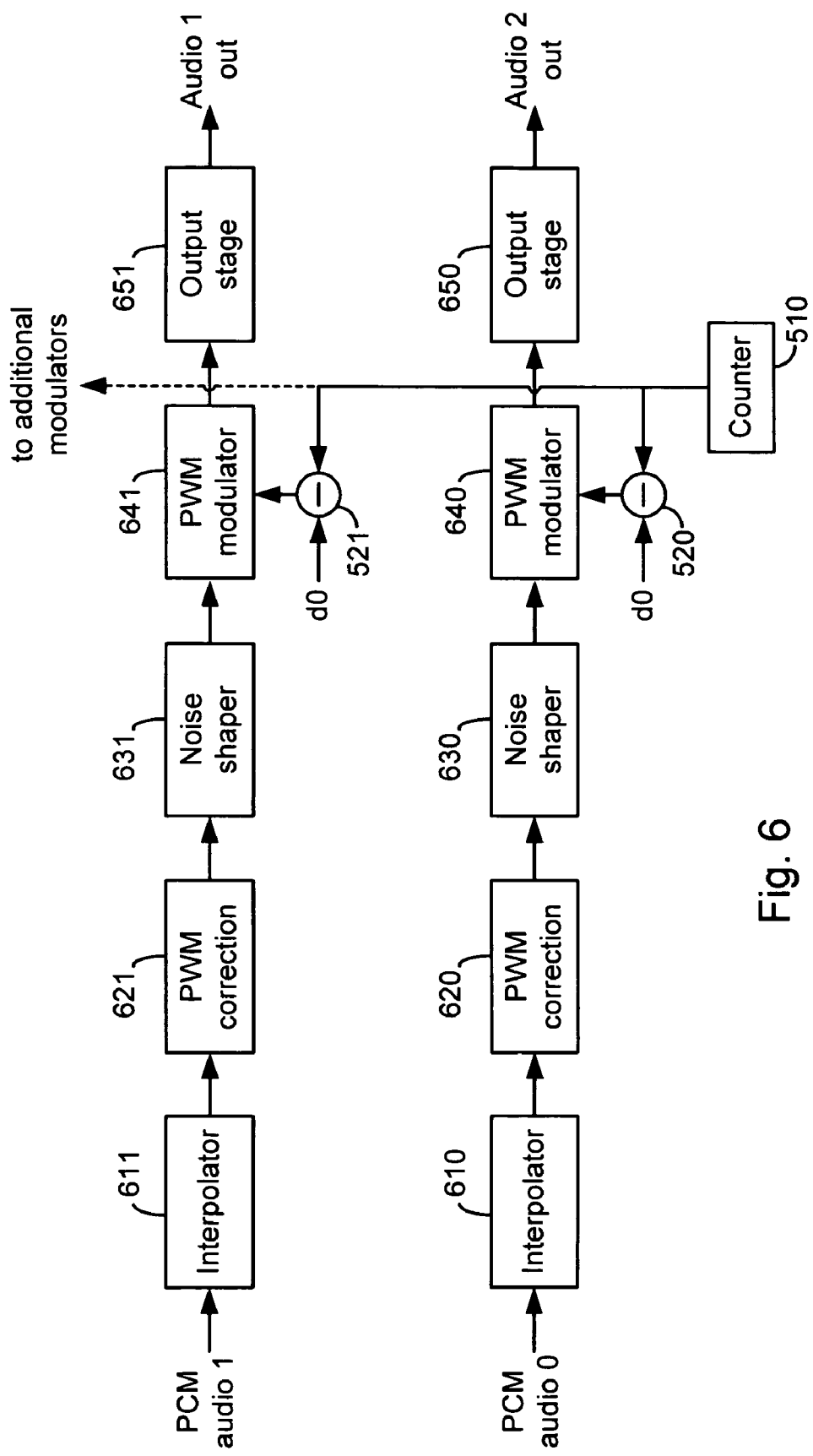
FIG. 6 is a functional block diagram showing an implementation of a multi-channel digital audio amplification system in accordance with one embodiment.

Referring to FIG. 6, a functional block diagram showing an implementation of a multi-channel digital audio amplification system in accordance with one embodiment is shown. In this embodiment, each channel includes an interpolator (610, 611), a PWM correction unit (620, 621), a noise shaper (630, 631), a modulator (640, 641) and an output stage (650, 651). The digital input stream for each channel is sent to the interpolator to be up-sampled to the switch rate of the output. The PWM correction block corrects for the non-linearities of the PWM process. The noise shaper reduces the high-precision input bit width to the limited bit width handled by the modulators (log 2(L+1) bits). Modulators 640 and 641 operate based on the output of a common counter 510, but each has a corresponding delay or offset that is added to or subtracted from the output of the counter, as described above. The output stage and output filter then reconstruct the audio output based on the signal received from the modulator.

Figure 7:
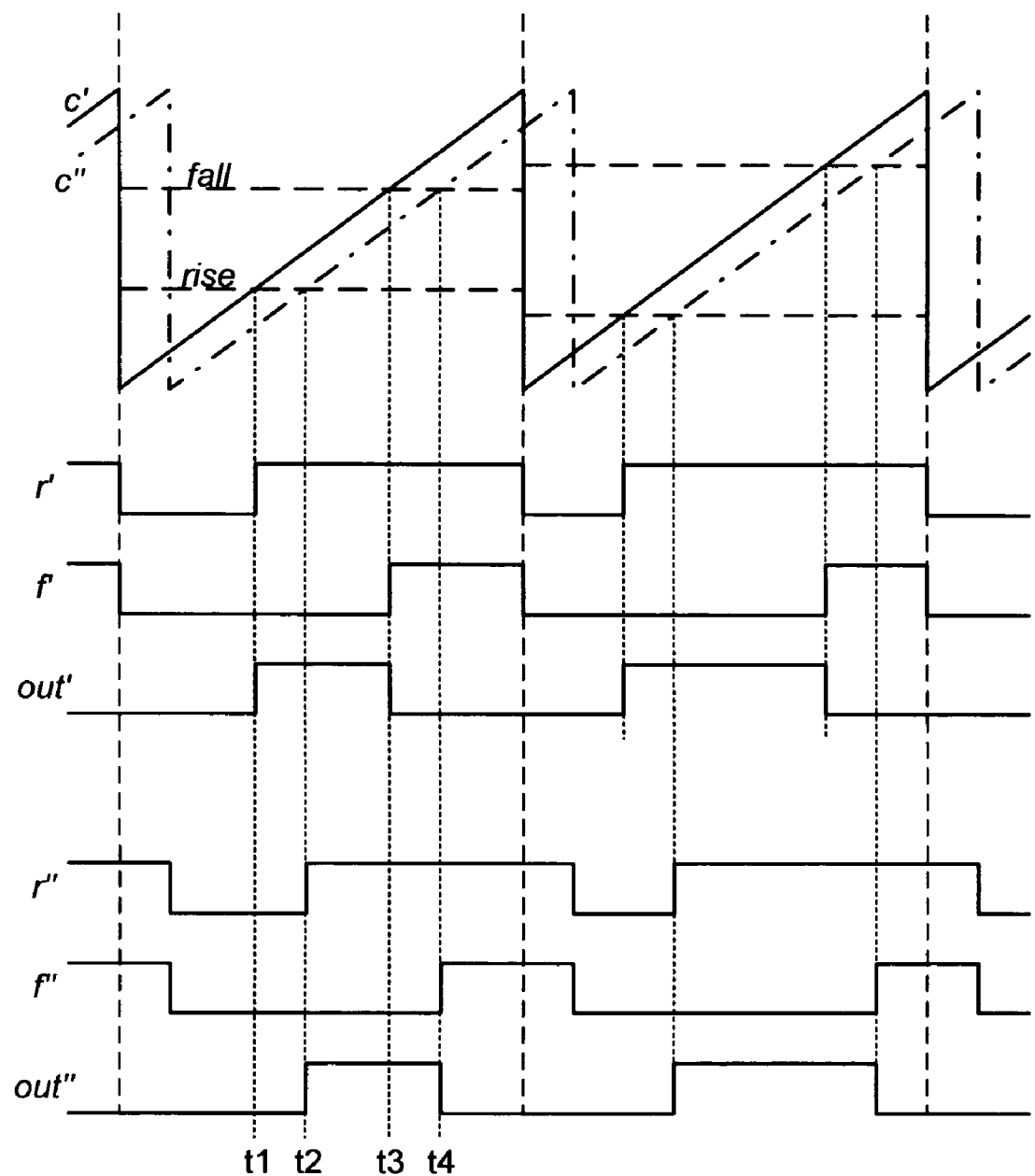
FIG. 7 is a diagram illustrating the signals associated with the system shown in FIG. 5.

The signals associated with the diagram of FIG. 5 are illustrated in FIG. 7. As noted above, the signal output by modulo unit 580 is indicated as c', while the signal output by modulo unit 581 is indicated as c". In the same manner, the signals output by components of modulator 500 are indicated by a single-prime mark ('), while the signals output by components of modulator 501 are indicated by a double-prime mark ("). It is assumed that the value (d1) input to difference unit 521 is greater than the value (d0) input to difference unit 520. It is assumed that the rise-time and fall-time values stored in that respective registers are the same for both modulators.

Referring to FIG. 7, timing signal c'is shown increasing from 0 to L−1, then returning to zero and repeating this pattern. Based upon the value of c', r' has a rising edge at time t1 and f' has a rising edge at time t3. Consequently, signal out' has a rising edge at time t1 and a falling edge at time t3. Because the value d1 is greater than d0, signal c"lags behind c', as indicated in FIG. 7. As a result, signals r", f" and out" of modulator 501 lag behind of the corresponding signals of modulator 500 by the same amount. That respective rising and falling edges are therefore at times t2 and t4, rather than times t1 and t3. Thus, the outputs of modulators 500 and 501 are staggered, and the rising and falling edges of the output pulses are not coincident. If the signals processed by each of the channels are not so closely correlated, the staggering of the outputs may reduce the chances that the rising and falling edges will be coincident, rather than eliminating this possibility. If the signals processed by each of the channels are not correlated, the staggering may have little effect on the noise.

In the embodiment described above, a delay is introduced between the signals of the respective channels. In other words, phase shifts between the signals in the different channels will be generated through the audio processing chain. In some instances, this might be acceptable, but it is contemplated that it is more likely to be unacceptable, particularly in high-performance audio applications. In these applications, it is typically desired to have the phases aligned, so that if every channel receives the same input, all of the outputs will be in phase. In these applications, it is desirable to introduce a complementary delay elsewhere in the channels to compensate for the delay introduced in the staggering of the signals. In other words, the total delay for each channel should be the same. The additional delays may be introduced in a number of places within the channels, such as in the interpolators or the PWM correction units.

One of the problems with correcting the phase shifts is that the delay between channels is typically a fraction of a sample, so DSP techniques like all-pass filtering should be used. The complementary phase shift can be inserted either before or after the interpolation, but it is preferred to insert this delay using the interpolator. It may therefore be helpful to describe the operation of the interpolator.

A typical linear interpolator can be described as follows. A stream of inputs x(n) are up-sampled by an integer factor W to a stream of outputs u(k), where W samples u(k) are generated for each input x(n).

```
for n = 0 to inf
    for i = 0 to W−1
        o = i/W
        u(n*W+i) = o*x(n) + (1−o)*x(n−1)
```

The outputs u(k) are generated on a straight line connecting x(n−1) and x(n). "o" is a number between 0 and 1 describing that "distance" from x(n−1). Therefore, for the first sample, i=0, we get o=0 and u(n*W)=x(n−1), then u(n*W+1)=x(n−1)+(x(n)−x(n−1))/W, and so on for i=2 . . . W−1.

We can add an offset to the distance o as shown below in order to generate an additional phase shift.

```
for n = 0 to inf
    for i = 0 to W−1
        o = (i + d/L)/W
        u(n*W+i) = o*x(n) + (1−o)*x(n−1)
```

When an offset is added as described above, it actually generates a "negative" delay (compared to the delay as a straightforward linear interpolation above) that will compensate for a delay of d clock cycles on an output pulse width of L cycles of the clk signal. The same approach of adding to the offset can be used for higher order interpolation schemes or for polyphase interpolation schemes. These types of implementations are considered to be within the scope of the invention.

For many applications, it is convenient to couple the delays in the modulator and the compensation in the interpolator as described, so that they automatically cancel and align the outputs of the different channels. For other applications, it may be desired not to align all delays as described above. It may be preferable to enable the delays to be set individually, so that both the output skew and the total relative delays of the individual channels can be controlled. The most flexible solution is a combination of these two approaches, where the skew on the output is automatically corrected, but at the same time an individual delay can be inserted for fine-grained control of the individual delay of each channel.

This can be implemented by modifying the linear interpolator as shown below.

```
for n = 0 to inf
    for i = 0 to W−1
        o = (i + d/L)/W − p
        j = 0
        if (o < 0)
            o = o+1
            j = 1
        u(n*W+i) = o*x(n−j) + (1−o)*x(n−j−1)
```

In this embodiment, an additional delay (or phase shift) p is subtracted from o. p is a number between 0 and 1, where 1 corresponds to a delay of one input sample duration. As a result, o can now become a negative value. Since the interpretation of o is the distance of the interpolation from x(n−1) toward x(n), a negative o is the distance from x(n−1) toward x(n−2). This is handled by the extra control variable j, which is used to select the correct set of samples x(n−1), x(n) or x(n−2). j is 0 for positive o and set to 1 for negative o. For negative o, we also add 1 to o so that o is now that desired distance from x(n−2) to x(n−1).

It follows that a register for one additional input sample may be required, compared to the straight interpolation. This is because the linear interpolation translates to 3 input values x(n), x(n−1) and x(n−2), compared to the two that are normally required, x(n) and x(n−1).

It should be noted that, while the embodiments described above use only two channels (and corresponding modulators), this should not be construed as limiting. Other embodiments may use more than two channels. Other embodiments may also use channels that are formed using more than a single audio controller chip. It is contemplated that, if multiple channels on multiple chips are utilized in embodiments of the present invention, it may be necessary to synchronize the components of the different chips. This synchronization may be performed in accordance with the disclosure of U.S. patent application Ser. No. 10/805,590, entitled "Phase Alignment of Audio Output Data in a Multi-Channel Configuration," filed on Mar. 19, 2004 by Hand, et al., which is incorporated herein by reference.

It should also be noted that many variations on the above systems and methods will be apparent to a person of ordinary skill upon reading this disclosure. For instance, rather than selecting the delays of the different channels so that the switching noise is evenly spread out through the interval L, it may be possible to stagger the channels by smaller amounts, or to stagger the channels unevenly. In one embodiment, each successive channel may be delayed by an additional amount d, whether there are two, three or n channels. There may also be variations with respect to such things as the generation of the timing signals for each of the modulators. In one embodiment, each modulator may have its own, separate counter rather than performing a modulo operation on a common timing signal. While this may necessitate a mechanism for synchronizing the different counters, it is nevertheless within the scope of the invention.

It should also be noted that, while the embodiments described above are implemented in a digital audio amplification system, the invention is not limited to digital systems. Alternative embodiments may be implemented in analog audio amplification systems as well.

Those of skill in the art will understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. The information and signals may be communicated between components of the disclosed systems using any suitable transport media, including wires, metallic traces, vias, optical fibers, and the like.

Those of skill will further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Those of skill in the art may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with general purpose processors, digital signal processors (DSPs) or other logic devices, application specific integrated circuits (ASICs), field programmable gate arrays (FPGAs), discrete gates or transistor logic, discrete hardware components, or any combination thereof designed to perform the functions described herein. A general purpose processor may be any conventional processor, controller, microcontroller, state machine or the like. A processor may also be implemented as a combination of computing devices, e.g., a combination of a DSP and a microprocessor, a plurality of microprocessors, one or more microprocessors in conjunction with a DSP core, or any other such configuration.

The steps of the methods or algorithms described in connection with the embodiments disclosed herein may be embodied directly in hardware, in software or firmware modules executed by a processor, or in a combination thereof. A software product may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

The benefits and advantages which may be provided by the present invention have been described above with regard to specific embodiments. These benefits and advantages, and any elements or limitations that may cause them to occur or to become more pronounced are not to be construed as critical, required, or essential features of any or all of the claims. As used herein, the terms "comprises," "comprising," or any other variations thereof, are intended to be interpreted as non-exclusively including the elements or limitations which follow those terms. Accordingly, a system, method, or other embodiment that comprises a set of elements is not limited to only those elements, and may include other elements not expressly listed or inherent to the claimed embodiment.

While the present invention has been described with reference to particular embodiments, it should be understood that the embodiments are illustrative and that the scope of the invention is not limited to these embodiments. Many variations, modifications, additions and improvements to the embodiments described above are possible. It is contemplated that these variations, modifications, additions and improvements fall within the scope of the invention.

What is claimed is:

1. A system comprising:
 a plurality of audio amplifier channels; and
 control circuitry coupled to the audio amplifier channels and configured to temporally shift switching edges in audio signals corresponding to at least one of the audio amplifier channels;
 wherein the audio amplifier channels comprise channels of a pulse width modulated (PWM) amplification system; and
 wherein the control circuitry comprises a plurality of modulators, each associated with one of the audio amplifier channels, wherein the modulator of each channel is configured to produce width-modulated pulses that are shifted temporally with respect to others of the audio amplifier channels.

2. The system of claim 1, wherein the system comprises n of the audio amplifier channels, and wherein each of the audio amplifier channels is shifted by L/n, wherein L is an interval between centers of consecutive width-modulated pulses.

3. The system of claim 1, wherein each modulator is coupled to a common counter.

4. The system of claim 3, wherein each modulator comprises a modulo unit coupled to receive a signal from the common counter, wherein the modulo unit is configured to generate a sawtooth-shaped signal, wherein each modulator generates the width-modulated pulses based upon the sawtooth-shaped signal received from the corresponding module unit.

5. A system comprising:
 a plurality of audio amplifier channels; and
 control circuitry coupled to the audio amplifier channels and configured to temporally shift switching edges in audio signals corresponding to at least one of the audio amplifier channels;
 wherein the control circuitry further comprises circuitry configured to implement a shift in the audio signals processed by each of the audio amplifier channels, wherein the shift in the audio signals is complementary to the shift of the switching edges.

6. The system of claim 5, wherein each of the audio amplifier channels comprises an interpolator and wherein the shift in the audio signals is implemented in the interpolator.

7. A system comprising:
 a plurality of audio amplifier channels; and
 control circuitry coupled to the audio amplifier channels and configured to temporally shift switching edges in audio signals corresponding to at least one of the audio amplifier channels;
 wherein the audio amplifier channels are implemented in a plurality of separate chips; and
 wherein the control circuitry is configured to synchronize the plurality of separate chips prior to implementing the shift of the switching edges or the shift in the audio signals.

8. A method comprising:
 providing a plurality of audio amplifier channels; and
 shifting, switching edges in audio signals corresponding to at least one of the audio amplifier channels;
 wherein providing a plurality of audio amplifier channels comprises providing a plurality of pulse width modulated (PWM) amplifier channels; and
 wherein shifting the switching edges comprises modulating the audio signals to produce width-modulated pulses that are shifted temporally with respect to others of the audio amplifier channels.

9. The method of claim 8, wherein the audio amplifier channels comprise n channels, wherein the method further comprises shifting each of the audio amplifier channels by L/n, wherein L is an interval between centers of consecutive width-modulated pulses.

10. The method of claim 8, further comprising, for each of the audio amplifier channels, providing a common counter signal to a modulator associated with the audio amplifier channel, performing a modulo operation on the common counter signal to generate a sawtooth-shaped signal, and generating the width-modulated pulses based upon the generated sawtooth-shaped signal.

11. A method comprising:
 providing a plurality of audio amplifier channels;
 shifting switching edges in audio signals corresponding to at least one of the audio amplifier channels; and
 implementing a shift in the audio signals processed by each of the audio amplifier channels, wherein the shift in the audio signals is complementary to the shift of the switching edges.

12. The method of claim 11, wherein implementing the complementary shift in the audio signals comprises interpolating the audio signals to include the complementary shift.

13. A method comprising:
 providing a plurality of audio amplifier channels that are implemented in a plurality of separate chips;
 synchronizing the plurality of separate chips prior to implementing the shift of the switching edges or the shift in the audio signals; and
 shifting switching edges in audio signals corresponding to at least one of the audio amplifier channels.

* * * * *